United States Patent [19]

Hirase et al.

[11] Patent Number: 4,981,723
[45] Date of Patent: Jan. 1, 1991

[54] CHEMICAL VAPOR DEPOSITION OF TUNGSTEN SILICIDE USING SILICON SUB-FLUORIDES

[75] Inventors: Ikuo Hirase, Toyosato, Japan; Denis Rufin, Countryside, Ill.; Michael Schack, Toyosato, Japan; Tooru Sumiya, Kanagawa, Japan; Masamichi Matsuura, Kanagawa, Japan; Sadayuki Urishima, Kanagawa, Japan

[73] Assignee: L'Air Liquide Societe Anonyme pour l'Etude et l'Exploitation des Procedes Georges Claude, Paris, France

[21] Appl. No.: 258,764

[22] Filed: Oct. 17, 1988

[30] Foreign Application Priority Data

Oct. 19, 1987 [FR] France ................................ 87 14383

[51] Int. Cl.$^5$ ............................................. C23C 16/00
[52] U.S. Cl. .............................. 427/255.2; 427/255.1; 427/314; 427/255; 427/248.1; 437/241
[58] Field of Search ................... 427/255.2, 255.1, 255, 427/93, 95, 314, 248.1

[56] References Cited

U.S. PATENT DOCUMENTS

| | | | |
|---|---|---|---|
| 4,481,299 | 11/1984 | Suzuki et al. | 427/38 |
| 4,636,401 | 11/1987 | Yamazaki et al. | 427/39 |
| 4,684,542 | 8/1987 | Jasinski et al. | 427/255.2 |

FOREIGN PATENT DOCUMENTS 61-276976 12/1986 Japan .

*Primary Examiner*—Norman Morgenstern
*Assistant Examiner*—Roy V. King
*Attorney, Agent, or Firm*—Oblon, Spivak, McClelland, Maier & Neustadt

[57] ABSTRACT

A process for depositing tungsten silicide films on a silicon substrate by chemical vapor deposition, comprises the steps of producing a silicon sub-fluoride by passing $SiF_4$ over pieces of silicon heated in a tubular oven about 1200°–1500° K., mixing gaseous $WF_6$ with the silicon sub-fluoride, and then immediately depositing the tungsten silicide films on said silicon substrate.

5 Claims, 5 Drawing Sheets

CHEMICAL VAPOR DEPOSITION OF TUNGSTEN SILICIDE USING SILICON SUB-FLUORIDES

BACKGROUND OF THE INVENTION

1. Field of the Invention

The present invention concerns a process for depositing refractory metal silicide by the technique of vapor phase chemical deposition for the manufacture of integrated circuits.

2. Discussion of the Background

In the manufacture of integrated circuits, to produce interconnections in particular, it is necessary to be able to deposit polycristalline silicon, or refractory metals, which are better conductors, or even intermediate compounds of the type $WSi_x$, for example, i.e. refractory metal silicides.

In well known manner, the following reaction is carried out:

$$WF_6 + 2SiH_4 \rightarrow WSi_2 + 6HF + H_2$$

which can produce $WSi_2$ from known precursors of W and Si. On the one hand, this technique has the disadvantage of producing large quantities of HF, which is detrimental for the pumps as well as for $SiO_2$. On the other hand, the Applicant has established that $WF_6$, in the presence of $SiF_4$, may give no deposit whatsoever under usual conditions.

SUMMARY OF THE INVENTION

The problem of depositing refractory metal silicides from essentially fluorinated precursors has been solved according to the invention. The deposition process according to the invention is characterized in that the refractory metal precursor is mixed in gaseous form with silicon sub-fluorides immediately before the deposition.

This process produces deposits which are particularly non-selective and satisfactory. The following examples and description concern deposits of $WSi_x$ in particular, but other refractory metals can also be considered, such as Mo and Ti. In the case of tungsten, according to the invention, it is preferable to use $WF_6$ as precursor.

BRIEF DESCRIPTION OF THE DRAWINGS

Other characteristics and advantages of the invention will appear from the detailed description which follows and the annexed drawings in which.

DETAILED DESCRIPTION OF THE PREFERRED EMBODIMENTS

Figure 1:
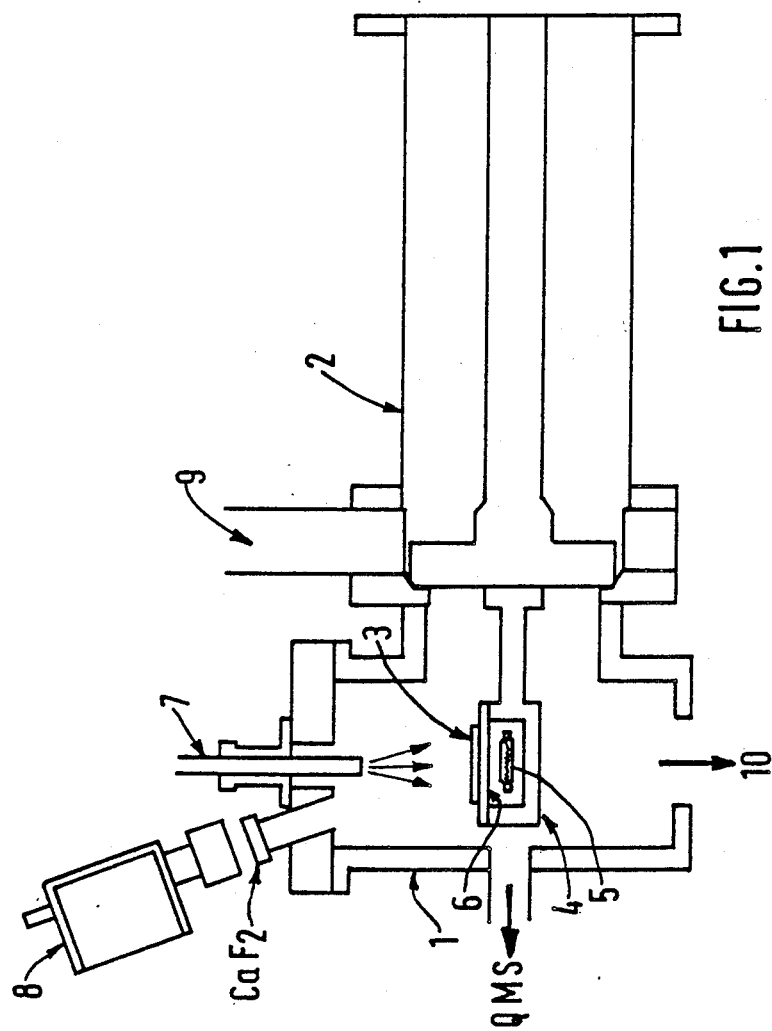
FIG. 1 is a schematic illustration of a reator with cold walls under partial vacuum to carry out the process.

On FIG. 1, there is shown a deposition oven comprising a sealed chamber 1, a vapor phase (CVD), provided with means 10 to produce a partial vacuum, not represented, and means for analysing gases (QMS), and a loading chamber 2 with a valve 9 enabling to isolate silicon wafers before loading them thereby avoiding contamination thereof. A wafer 3 is disposed in the sealed reaction chamber 1 on a support 4 comprising a halogen lamp 5, which anables to heat the wafer 3 through a quartz plate 6. The precursor and carrier gases are introduced above the treated wafer 3 by means of a nozzle 7. Temperatures are measured with an infrared thermometer 8.

Figure 2:
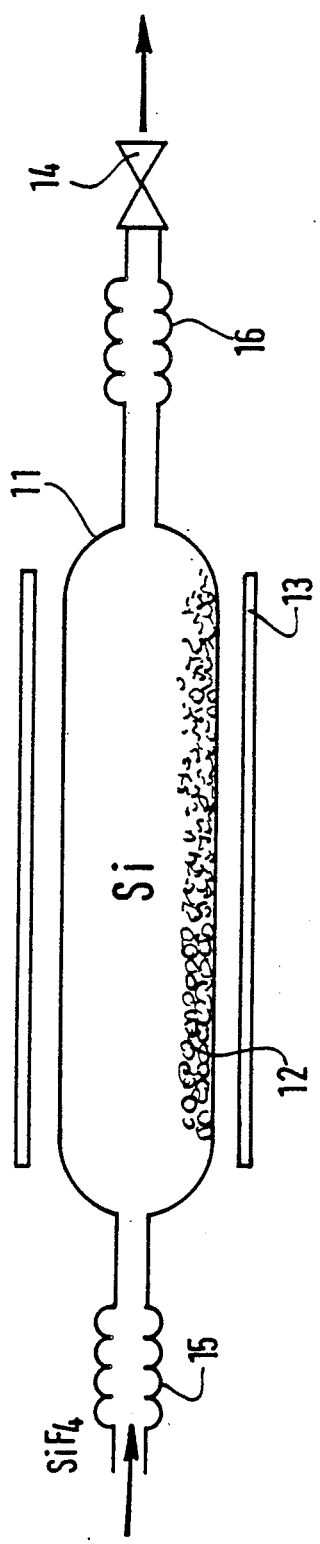
FIG. 2 is a schematic illustration of a tubular oven to produce sub-fluorides.

In FIG. 2, there is shown a tubular oven to produce sub-fluorides.

The $SiF_4$ load passes in the oven 11 loaded with pieces of silicon. The oven 11 is heated by means of electrical resistances capable of raising the temperature of Si to from about 1200 to 1500 K. A valve 14 enables to insulate the oven 11 from the CVD device, (downstream of the valve 14). Flexible ducts 15, 16 connect the oven on the one hand to a source of $SiF_4$ (not represented) and to the valve 14.

The species $SiF_2$ and $SiF_3$ are produced by passing $SiF_4$ on pieces of Si heated at 1400 K., as shown in FIG. 2. Under these conditions of temperature, the mixture of fluoride and sub-fluorides comprises about 51% $SiF_3$, 46% $SiF_4$ and 3% $SiF_2$.

In this mixture of the W, $WF_6$ and silicon precursors, the silicon sub-fluorides react as follows:

$$aWF_6 + bSiF_3 + cSiF_2 \rightarrow gWSi_x + hSiF_4$$

where a, b, c, g and h represent thermodynamic parameters.

Figure 3:
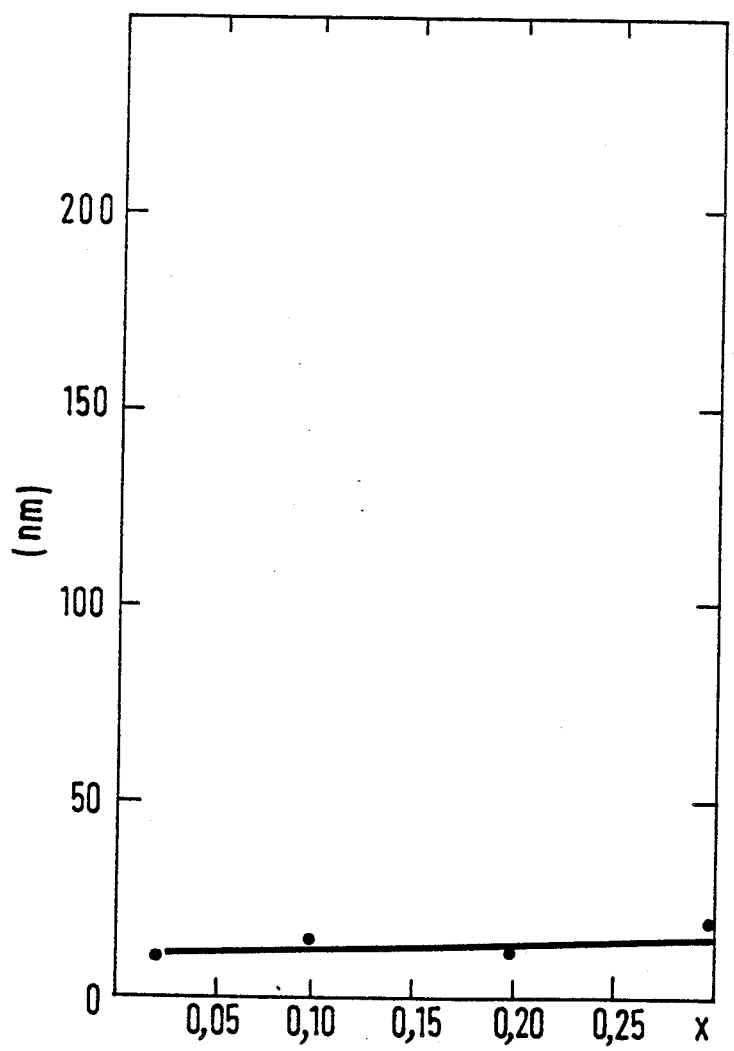
FIGS. 3 to 7 represent curves showing the results of deposits made as described hereinafter.

FIG. 3 shows that no deposit is obtained (thickness of the deposit (mm) as a fonction of the $WF_6/SF_4$ flow ratio) with a mixture of $WF_6$ and $SF_4$, after a deposition time of 7 mn and when the temperature of silicon wafer is 400° C.

Figure 5:
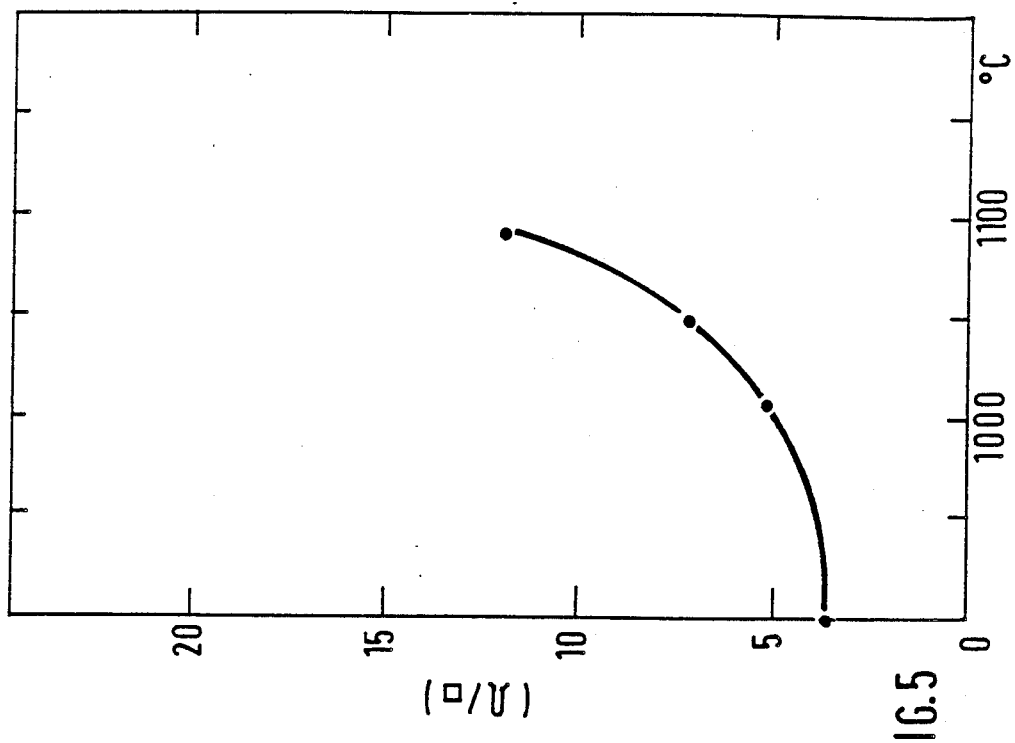
Figure 4:
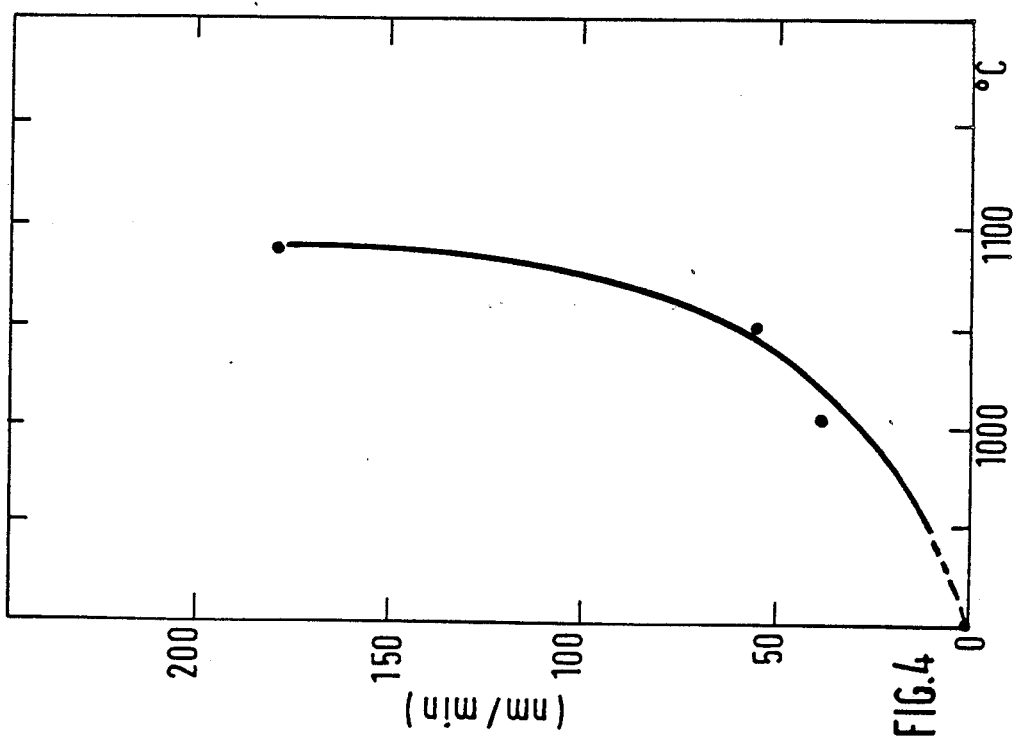

FIGS. 4 and 5 respectively represent the speed of deposition (nm/min) and the resistivity of the deposit obtained for various temperatures of the $SiF_4$ oven. The flow ratio $WF_6/SiF_4$ is 1/50, the pressure is of the order of 0.472–0.482 Torr, and the temperature of the wafer is 350° C.

In a particular embodiment, hydrogen can be mixed with the precursors and carrier gas normally used (Ar and He); a deposition takes place when the temperature of the Si oven is 1090° C., the temperature of the silicon wafer is 350° C. and the deposit time is 5 mm.

Figure 7:
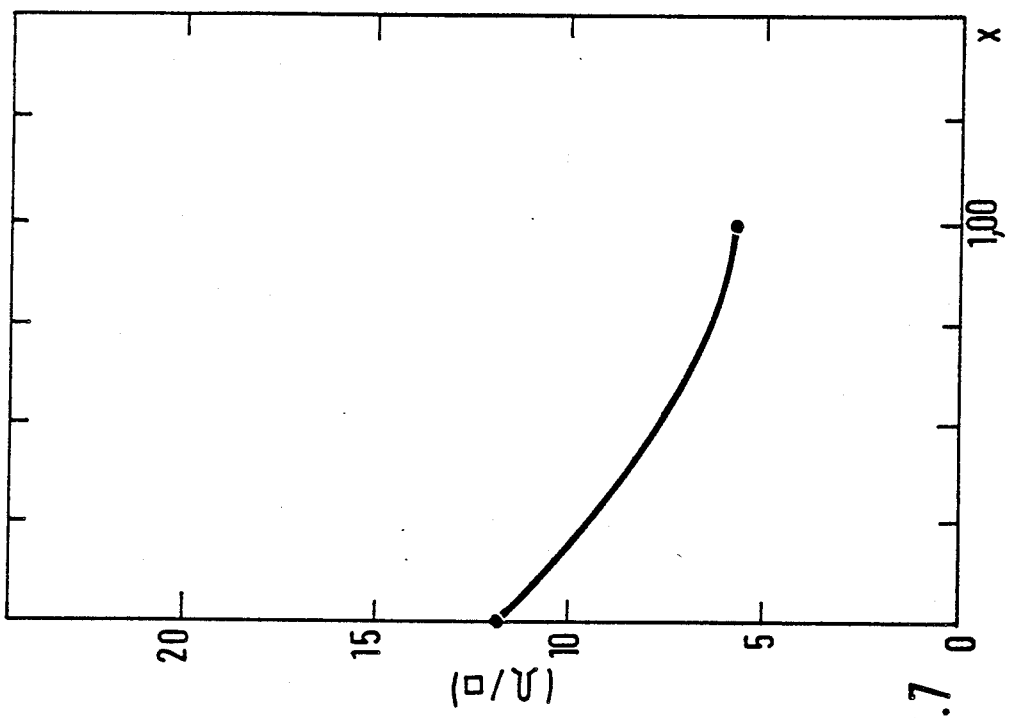
Figure 6:
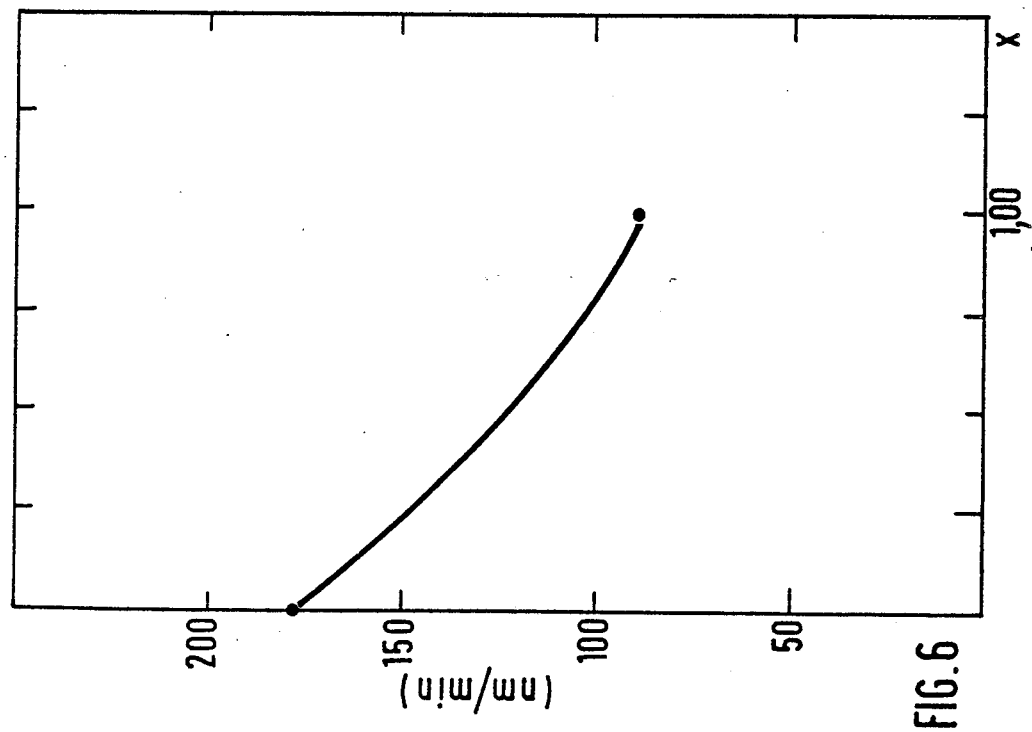

FIGS. 6 and 7 respectively represent the speed of deposition and the resistivity of the layer deposited as a function of the ratio x of the flows $H_2/SiF_4$.

We claim:

1. A process for depositing tungsten silicides on a silicon substrate by vapor phase chemical deposition, comprising the steps of:
   producing a silicon sub-fluoride by passing $SiF_4$ over pieces of silicon heated in a tubular oven at about 1200°–1500° K.;
   mixing in gaseous form $WF_6$ with said silicon sub-fluoride, and then immediately
   depositing said tungsten silicides on said silicon substrate.

2. The process of claim 1, wherein said silicon substrate is heated in the deposition step through a quartz plate underlying the silicon substrate.

3. The process of claim 1, wherein said deposition is carried out in a reactor with cold walls maintained under partial vacuum.

4. The process of claim 1, wherein said $WF_6$ and silicon sub-fluoride are mixed with a carrier gas.

5. The process of claim 4, wherein said carrier gas is selected from the group consisting of Ar, He, and $H_2$.

* * * * *